United States Patent
Eckardt et al.

(10) Patent No.: US 7,466,020 B2
(45) Date of Patent: Dec. 16, 2008

(54) POWER MODULE

(75) Inventors: Dieter Eckardt, Herzogenaurach (DE); Carsten Rebbereh, Fürth (DE)

(73) Assignee: Siemens Aktiengesellschaft, München (DE)

( * ) Notice: Subject to any disclaimer, the term of this patent is extended or adjusted under 35 U.S.C. 154(b) by 222 days.

(21) Appl. No.: 11/568,087

(22) PCT Filed: Apr. 14, 2005

(86) PCT No.: PCT/EP2005/051656
§ 371 (c)(1), (2), (4) Date: Oct. 19, 2006

(87) PCT Pub. No.: WO2005/101504
PCT Pub. Date: Oct. 27, 2005

(65) Prior Publication Data
US 2007/0229143 A1   Oct. 4, 2007

(30) Foreign Application Priority Data
Apr. 19, 2004   (DE) ........................ 10 2004 019 443

(51) Int. Cl.
*H01L 23/02* (2006.01)
(52) U.S. Cl. ........................ 257/686; 257/723
(58) Field of Classification Search ........... 257/686, 257/723
See application file for complete search history.

(56) References Cited

U.S. PATENT DOCUMENTS

| 5,532,512 A | 7/1996 | Fillion et al. |
| 6,630,727 B1 * | 10/2003 | Tutsch et al. ............... 257/668 |
| 6,642,576 B1 | 11/2003 | Shirasawa et al. |
| 2003/0006493 A1 | 1/2003 | Lee |
| 2003/0111721 A1 | 6/2003 | Nakanishi et al. |
| 2006/0197220 A1 * | 9/2006 | Beer ........................... 257/723 |

FOREIGN PATENT DOCUMENTS

| EP | 1 170 794 A1 | 1/2002 |
| EP | 1 317 001 A1 | 6/2003 |
| WO | WO 03/030247 A2 | 4/2003 |

* cited by examiner

*Primary Examiner*—Roy K Potter
(74) *Attorney, Agent, or Firm*—Henry M. Feiereisen; Ursula B. Day

(57) ABSTRACT

The invention relates to a power module comprising a substrate (2), whose surfaces are provided with at least one electrically conductive layer (4, 6), at least one active semiconductor chip (8), which is electrically connected to an electrically conductive layer (6), a film (12) consisting of an electrically conductive material, which is in close contact with the surfaces of the semiconductor chips (8) of the electrically conductive layer (6) and the substrate (2) and is provided with planar printed conductors (16). According to the invention: the module is equipped with a second film (18), which is in close contact with the surfaces of the printed conductors (16) and the first film (12); a passive semiconductor chip (22) is applied to said second film (18), above the active semiconductor chip (8) and is electrically connected to the planar printed conductor (16) lying below by means of a window (14) that is configured in the second film (18); the module is equipped with a third film (24), which is in close contact with the surfaces of the passive semiconductor chip (22) and the second film (18) and said third film (24) is provided with a planar printed conductor (28), which is conductively connected to the conductive layer (6) lying below the active semiconductor chip (8). The invention thus provides a compact power module that can comprise complex topologies.

15 Claims, 4 Drawing Sheets

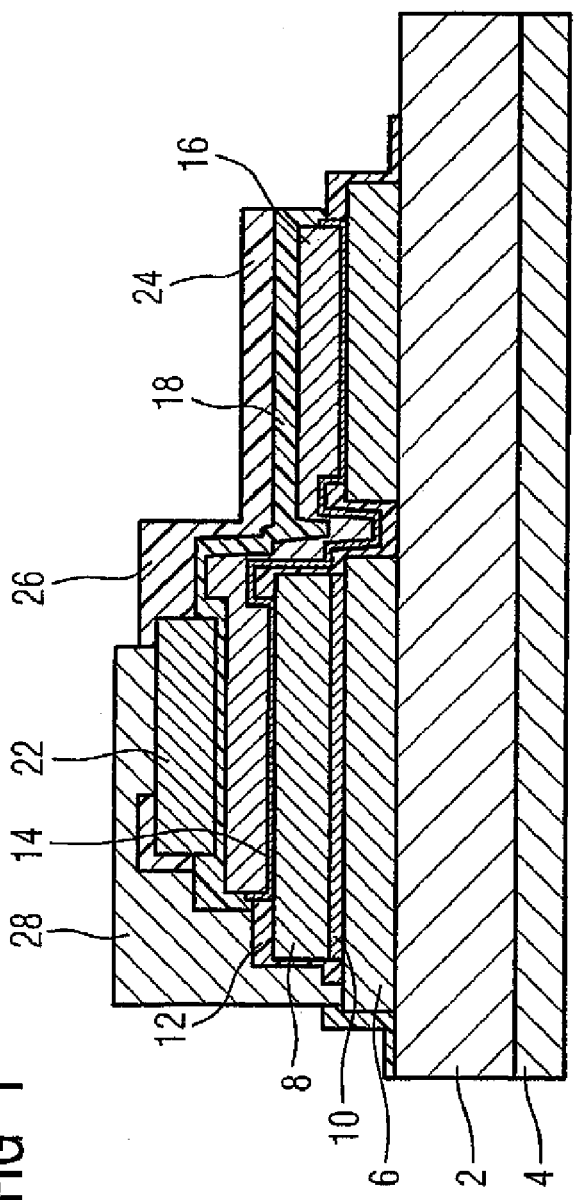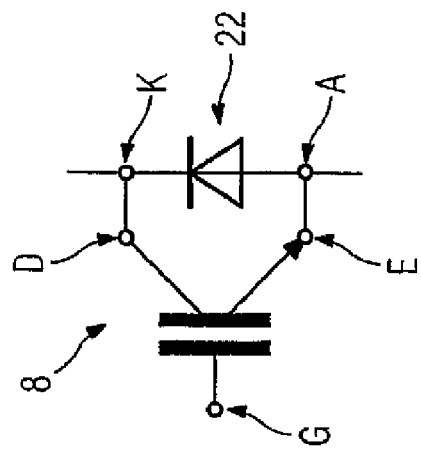

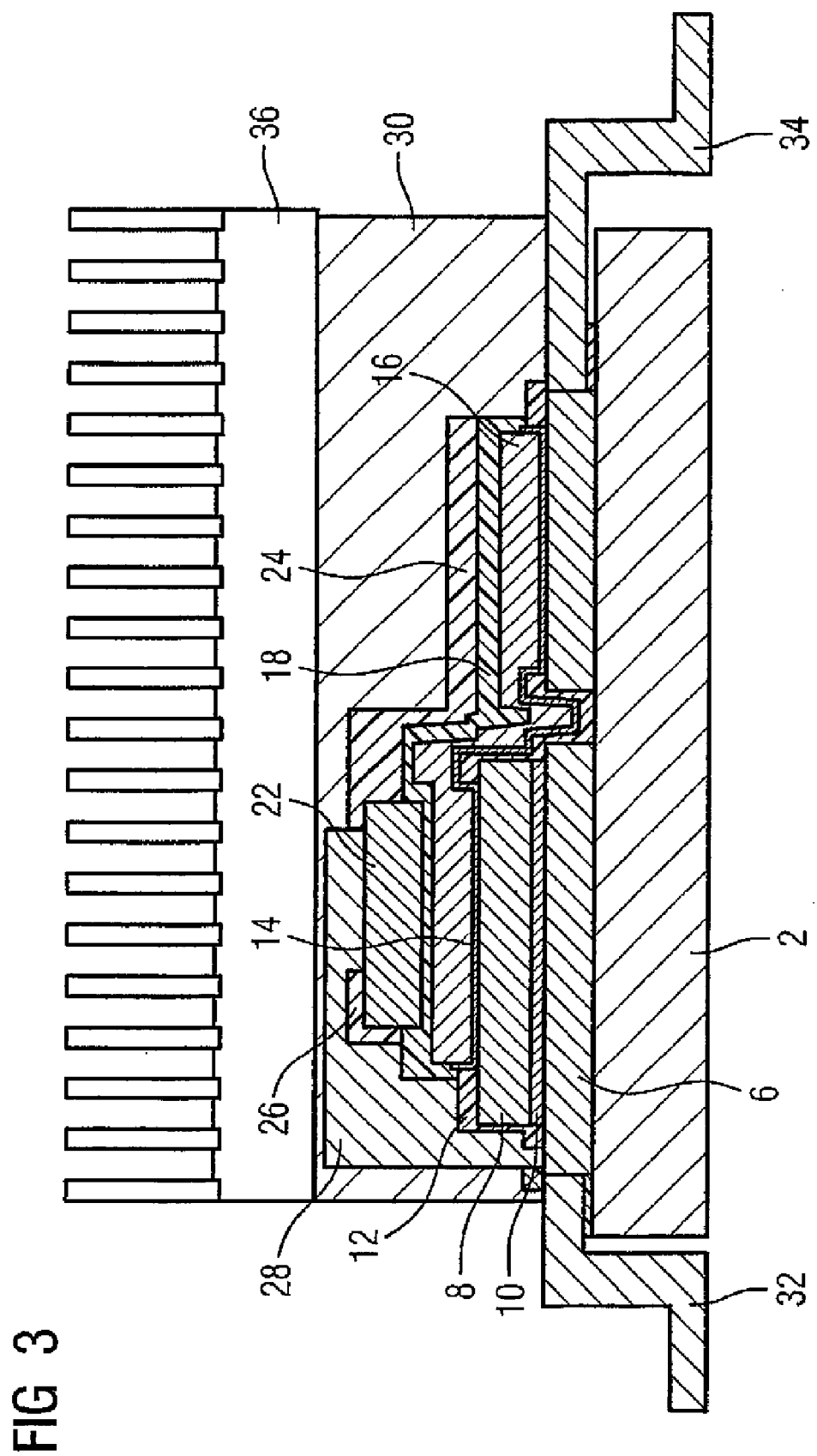

POWER MODULE

BACKGROUND OF THE INVENTION

The invention relates to a power module.

Power electronic components such as switchable semiconductors and diodes are often combined in power modules in order to implement certain topologies such as pulse converters and/or power rectifiers in one module. The individual components in such a module are connected by bonding wires that lead from one power component, for example a switchable semiconductor chip, in particular an Insulated Gate Bipolar Transistor chip (IGBT), to another power component, for example a diode chip, or to a printed conductor on a substrate of this power module.

These bonding wires have the following disadvantages however:

- The inductance introduced into the module by each bond connection is relatively high, whereby the individual semiconductor chips are subject to a higher voltage load during a switching action. It is not possible to reduce significantly this parasitic inductance for geometric and fabrication reasons.
- The current density at the bonding point itself is relatively high, reducing the reliability of the connection.
- It is almost impossible to implement more complex topologies by this fabrication technique because of the crossover of bond connections.

U.S. Pat. No. 5,532,512 discloses a power semiconductor device, which comprises a plurality of semiconductor devices that are stacked one above the other on a substrate. Each semiconductor device comprises just one semiconductor chip that is provided with contact pads. These contact pads are soldered to metallizations on the semiconductor chip. In order to produce a half-bridge topology, two such semiconductor chips are required. These two semiconductor chips are stacked on top of each other and soldered together. This stack of semiconductor chips is electrically connected to an electrically conducting layer of a substrate. Other topologies (parallel connection of a plurality of semiconductor chips) can be achieved by such a fabricated semiconductor chip.

WO 03/030247 A2 discloses a power module in which at least one semiconductor chip is bonded to an electrically conducting layer of a substrate. A film made of electrically insulating material lies in close contact with the surfaces of the semiconductor chip, the electrically conducting layer and the substrate. To enable contact to be made with the two contacts of the semiconductor chip, this film has at least one window, which exposes the contact surface of a contact of the semiconductor chip. A layer made of electrically conducting material is applied over the whole surface of this film including its windows. Planar interconnects are made from this electrically conducting layer by a photolithographic process. In this embodiment, the film is laminated on.

In this power module, all active and passive semiconductor chips are arranged side by side on a substrate and connected together electrically by means of planar interconnects. To implement certain topologies such,as pulse converters and/or power rectifiers in one module, such a module will have a very large surface area.

The object of the invention is to develop a power module of the type cited in the introduction in such a way that it is compact.

SUMMARY OF THE INVENTION

This object is achieved according to the invention by a power module which includes a substrate, whose surfaces are provided with at least one electrically conducting layer, at least one active semiconductor chip, which is electrically connected to an electrically conducting layer, a film made of an electrically insulating material, which lies in close contact with the surfaces of the semiconductor chip, of the electrically conducting layer and of the substrate (2), and is provided with planar printed conductors (16), wherein a second film is provided, which lies in close contact with the surfaces of the planar printed conductors and of the first film, wherein a passive semiconductor chip is mounted above the active semiconductor chip on this second film, and is electrically connected to the underlying planar printed conductor by means of a window in this second film, wherein a third film is provided, which lies in close contact with the surfaces of the passive semiconductor chip and of the second film, and wherein this third film is provided with a planar printed conductor, which is conductively connected to the conducting layer (6) below the active semiconductor chip.

By at least two semiconductor chips of the power module being stacked one above the other according to the invention, with the known planar technology being used to wire them up, a very compact power module is obtained having minimum interconnect lengths. Since planar connection technology is used to connect semiconductor chips together electrically, the thickness of a power module according to the invention only differs insignificantly compared with a conventional power module in planar technology.

The semiconductor-chip stack produced in this way is advantageously provided with a potting compound such that the power module is made cuboid in shape. In particular, this potting compound is a thermal conductor.

This cuboid-shaped embodiment of the power module then allows at least one flat face of this power module to be provided with a heatsink, whereby direct cooling of the stacked semiconductor chips of the power module is achieved.

In a further advantageous embodiment, the power module comprises two modules having stacked semiconductor chips, which are arranged side by side, spatially offset and facing each other, such that their coated substrates each form a flat face of the power module. A potting compound, which in particular is a thermal conductor, is provided to fix mechanically these two modules. Such a power module combines the half-bridge components of a rectifier circuit in one compact module.

In order to improve the cooling of the stacked semiconductor chips of such a half-bridge power module, each of its flat faces is provided with a heatsink.

BRIEF DESCRIPTION OF THE DRAWING

The invention is explained further with reference to the drawing, in which a plurality of embodiments of the power module according to the invention are shown schematically.

FIG. 1 shows a first embodiment of a power module according to the invention, FIG. 2 shows an equivalent electrical circuit pertaining to the power module of FIG. 1, FIG. 3 shows an advantageous embodiment of the power module of FIG. 1.

DETAILED DESCRIPTION OF PREFERRED EMBODIMENTS

Figure 5:
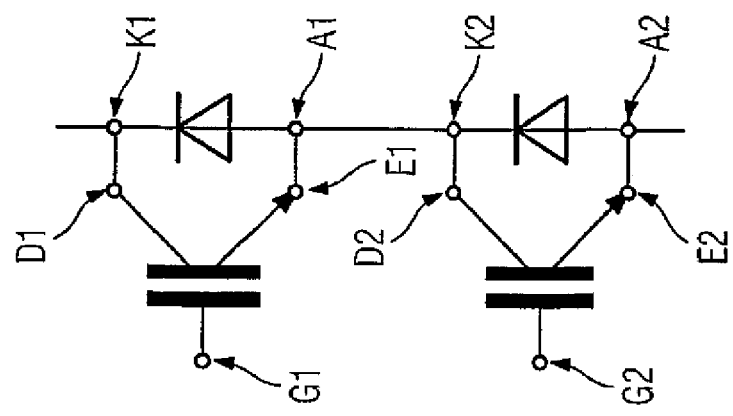
FIG. 5 shows its pertaining equivalent electrical circuit.

In FIG. 1, 2 denotes a substrate, 4 denotes a lower electrically conducting layer, 6 an upper electrically conducting layer and 8 a semiconductor chip. This semiconductor chip 8 is an active semiconductor chip, in particular a switchable semiconductor chip. An Insulated Gate Bipolar Transistor chip (IGBT) is used as the switchable semiconductor chip, for example. These electrically conducting layers 4 and 6 are made of copper. A layer 10 made of soft solder is arranged between the semiconductor chip 8 and the upper electrically conducting layer 6 of the substrate 2. A film 12 made of an electrically insulating material lies in close contact with the surfaces of the substrate 2, of the upper electrically conducting layer 6 and of the semiconductor chip 8. To enable contact to be made with the upper contacts (emitter and gate contact E and G) of the semiconductor chip 8, this film 12 has a window 14, which exposes these contact surfaces of the upper contacts of the semiconductor chip 8. A layer made of electrically conducting material is applied over the whole surface of this film 12 including its window 14. A photolithographic process is used to make planar printed conductors 16, which make contact with an upper contact E or G of the semiconductor chip 8. A second film 18 made of electrically insulating material is disposed over this arrangement such that it lies in close contact with the surfaces of the planar printed conductors 16 and of the first film 12. This is achieved by each film 12 and 18 being laminated on. This film 18 also comprises a window 20, so that an underlying planar printed conductor is exposed. A passive semiconductor chip 22, for example a diode chip, is mounted on this film 18 within the window 20 above the active semiconductor chip 8. A contact surface (anode) of this passive semiconductor chip 22 makes contact with the exposed planar printed conductor 16. A third film 24 made of electrically insulating material is arranged over this semiconductor-chip stack such that it lies in close contact with the surfaces of the passive semiconductor chip 22 and of the second film 18. This third film 24 also has a window 26 to enable contact to be made with the upper contact surface of this passive semiconductor chip 22. An electrically conducting layer is also applied to this third film 24, from which a planar printed conductor 28 is produced by a photolithographic process. This electrically conducting layer has been produced such that this layer makes contact with the electrically conducting layer 6 below the active semiconductor chip 8 and with an upper contact surface of the passive semiconductor chip 22. By this stacking of a plurality of semiconductor chips 8 and 22, which are connected together electrically by means of the known planar technology, a highly compact power module is obtained that is not substantially thicker than a known power module but which occupies less space. FIG. 2 shows in more detail an equivalent electrical circuit of the power module of FIG. 1. From this equivalent circuit it can be seen that an IGBT is provided as the active semiconductor chip 8 and a diode as the passive semiconductor chip 22. This diode is electrically connected in anti-parallel with the drain-emitter channel of the IGBT. The contacts G and E of this IGBT for the active semiconductor chip 8 are arranged on the side facing away from the substrate 2 (upper face). The drain contact D is formed on the side of the active semiconductor chip 8 facing the substrate 2 (lower face). That side of the passive semiconductor chip 22 facing the active semiconductor chip 8 (lower face) is the anode contact A, with the side of the passive semiconductor chip 22 facing away from the active semiconductor chip 8 (upper face) being the cathode contact K. The equivalent circuit shows that the upper face of the passive semiconductor chip 22 must be electrically connected to the lower face of the active semiconductor chip 8. This is performed by the planar printed conductor 28. There is also the option to lead the cathode contact K of the passive semiconductor chip 22 and the drain contact D of the active semiconductor chip 8 out of this semiconductor-chip stack in order then to connect them together electrically in the bonding area of the power module.

FIG. 3 shows in greater detail an advantageous embodiment of the power module of FIG. 1. This embodiment differs from the embodiment of FIG. 1 by the semiconductor-chip stack being provided with a potting compound 30 such that the power module is made cuboid in shape. In addition, the substrate 2 no longer has a lower electrically conducting layer 4. The electrically conducting layer 6 on the side of the substrate 2 facing the semiconductor chips 8 and 22 is provided with printed conductors 32 and 34, which protrude out of the potted power module. The printed conductor 32 forms the drain contact D of the active semiconductor chip 8, whereas the printed conductor 34 forms the gate contact G of the active semiconductor chip 8.

In addition, unlike the embodiment of FIG. 1, this embodiment has a heatsink 36, which is mounted on a flat face of the cuboid-shaped power module. In the diagram shown, this heatsink 36 is arranged on the flat face that faces away from the substrate 2. In order to improve the heat dissipation from inside the power module, the potting compound 30 is optimized for its thermal conductivity.

Figure 4:
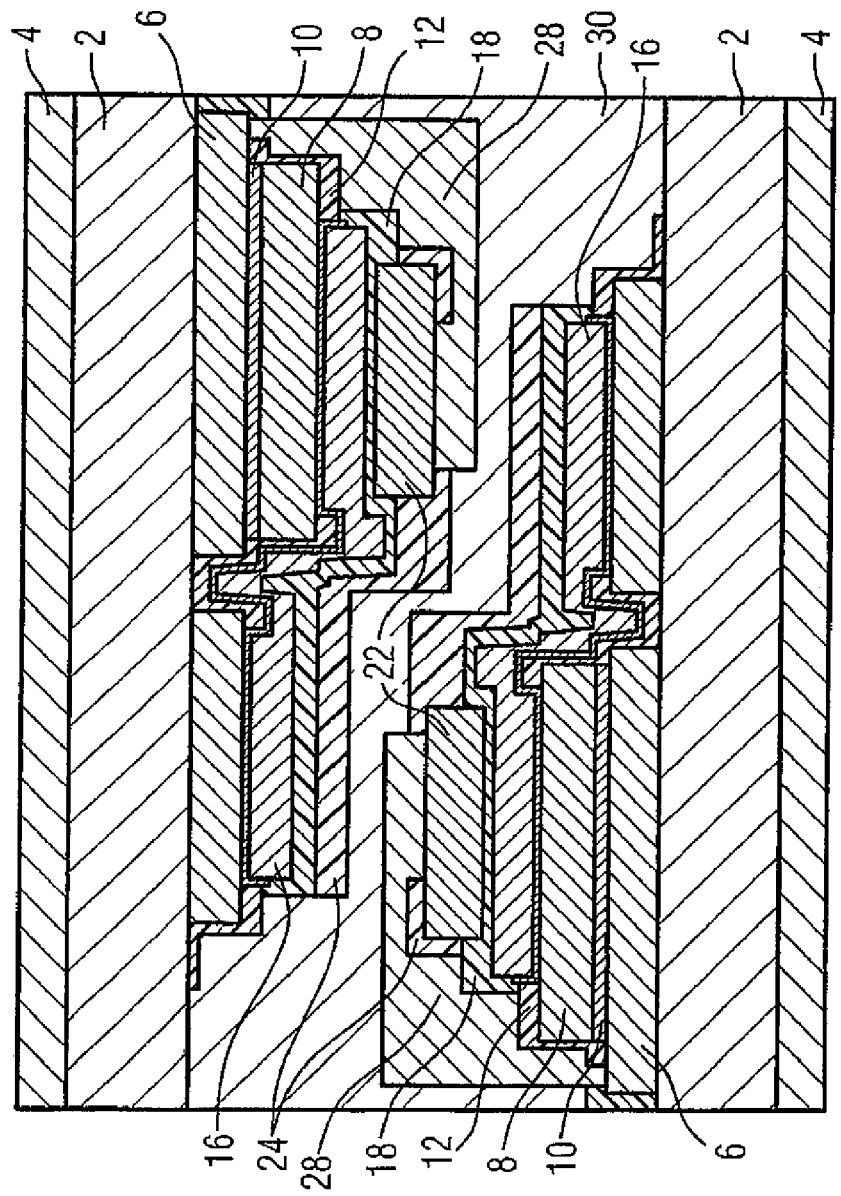
FIG. 4 shows a second embodiment of a power module according to the invention, where

FIG. 4 shows schematically a second embodiment of the power module according to the invention. An equivalent electrical circuit pertaining to this second embodiment is shown in FIG. 5. According to this equivalent circuit, two modules as shown in FIG. 2 are connected electrically in series, thereby producing a half-bridge module for a rectifier circuit. It can be seen in FIG. 4 that two modules as shown in FIG. 1 are integrated in one power module. In order to be able to accommodate these two modules in a space-saving way in one power module, they are arranged side by side, spatially offset and facing each other. The electrically conducting layers 4 of the two substrates 2 of the two semiconductor-chip stacks thereby each form a flat face of the cuboid-shaped power module. So that this spatial arrangement of both semiconductor-chip stacks is mechanically fixed, the empty space between these two separate semiconductor-chip stacks is filled with a potting compound 30. In this embodiment, the potting compound 30 can again be optimized for thermal conductivity. The electrically conducting connection of these two modules is effected by leading out contacts, which are not shown individually in this diagram for the sake of clarity. As shown in the pertaining equivalent circuit, this connection is the electrically conducting connection between the emitter contact E1/anode contact A1 and the drain contact D2/cathode contact K2. This means that the electrically conducting layer 6 below the one active semiconductor chip 8 (drain contact) must be connected electrically to one of the planar printed conductors 16 of the facing semiconductor-chip stack. This module wiring can again be performed in the bonding area of the power module.

Figure 6:
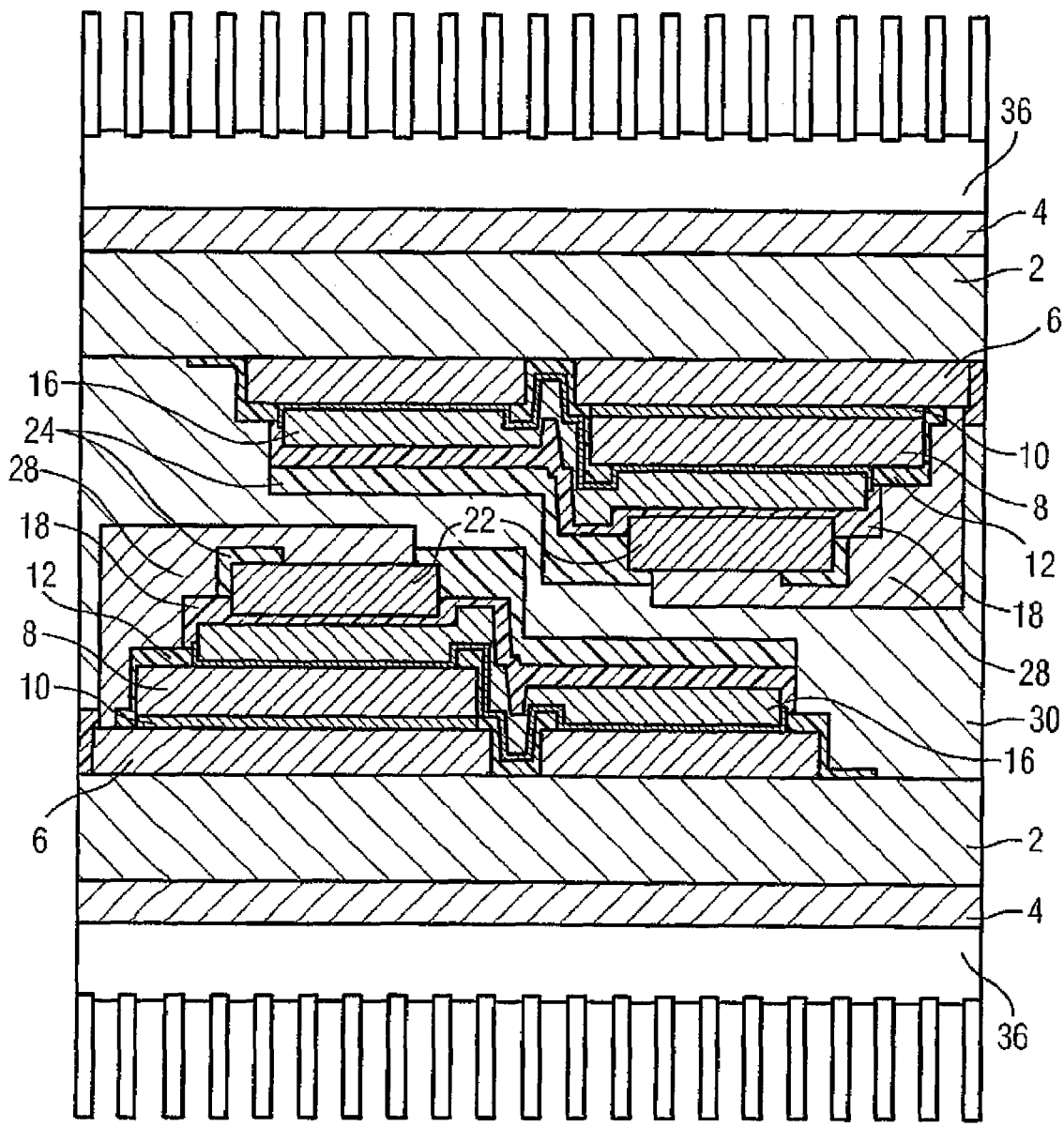
FIG. 6 shows an advantageous embodiment of the power module of FIG. 4.

FIG. 6 shows an advantageous embodiment of the power module of FIG. 4. This advantageous embodiment differs from the embodiment shown in FIG. 4 only by the two electrically conducting layers 4 of the two substrates 2 being each provided with a heatsink 36.

By the stacking, according to the invention, of semiconductor chips in conjunction with the known planar technology, a compact power module is obtained in various topologies. By stacking semiconductor chips, which are connected electrically by means of planar technology, complex power modules can be implemented that are almost impossible to implement using bonding wires because of crossing bonding wires.

What is claimed is:

1. A power module, comprising:
   a substrate having at least one major surface;
   at least one electrically conducting layer disposed on the at least one major surface;
   at least one active semiconductor chip electrically connected to the at least one electrically conducting layer;
   a first film having planar conductor tracks and being made of an electrically insulating material contacting a surface of the at least one active semiconductor chip, a surface of the at least one electrically conducting layer, and a surface of the substrate;
   a second film contacting surfaces of the planar conductor tracks and of the first film;
   a passive semiconductor chip mounted on the second film above the at least one active semiconductor chip, said passive semiconductor chip being electrically connected to the planar conductor tracks via a window disposed in the second film; and
   a third film contacting a surface of the passive semiconductor chip and of the second film, wherein the third film comprises a planar conductor track, which is electrically connected with the at least one electrically conducting layer located below the active semiconductor chip.

2. The power module of claim 1, wherein the power module is at least partially enclosed in a potting compound so that the power module assumes a cuboid shape.

3. The power module of claim 1, further comprising a heat sink attached to a major surface of the power module.

4. The power module of claim 2, wherein the potting compound is a thermal conductor.

5. The power module of claim 2, wherein at least one active semiconductor chip and the passive semiconductor chip each comprise contact terminals protruding from the polling compound.

6. The power module of claim 1, wherein the at least one active semiconductor chip is a gate-controlled turn-off semiconductor switch.

7. The power module of claim 6, wherein the gate-controlled turn-off semiconductor switch is an Insulated Gate Bipolar Transistor (IGBT).

8. The power module of claim 1, wherein the passive semiconductor chip is a diode chip.

9. A power module assembly, comprising:
   at least two power modules, each power module including
   a substrate having two major surfaces;
     a first electrically conducting layer disposed on a first of the two major surfaces and a second electrically conducting layer disposed on a second of the two major surfaces;
     at least one active semiconductor chip electrically connected to the first electrically conducting layer;
     a first film having planar conductor tracks and being made of an electrically insulating material contacting a surface of the at least one active semiconductor chip, a surface of the first electrically conducting layer, and a surface of the substrate;
     a second film contacting surfaces of the planar conductor tracks and of the first film;
     a passive semiconductor chip mounted on the second film above the at least one active semiconductor chip, said passive semiconductor chip being electrically connected to the planar conductor tracks via a window disposed in the second film; and
     a third film contacting a surface of the passive semiconductor chip and of the second film, wherein the third film comprises a planar conductor track, which is electrically connected with the first electrically conducting layer located below the active semiconductor chip,
   wherein the at least two power modules are disposed above another with a lateral offset, with the second electrically conducting layers of the power modules facing away from each other and forming respective outwardly oriented, flat exterior surfaces of the power module assembly, and
   a potting compound for mechanically affixing the at least two power modules.

10. The power module assembly of claim 9, further comprising a plurality of heat sinks, with each heat sink being attached to a different flat exterior surface of the power module assembly.

11. The power module assembly of claim 9, wherein the potting compound is a thermal conductor.

12. The power module assembly of claim 9, wherein the semiconductor chips of the at least two power modules comprise contact terminals that protrude from of the potting compound.

13. The power module assembly of claim 9, wherein the at least one active semiconductor chip is a gate-controlled turn-off semiconductor switch.

14. The power module assembly of claim 13, wherein the gate-controlled turn-off semiconductor switch is an Insulated Gate Bipolar Transistor (IGBT).

15. The power module assembly of claim 8, wherein the passive semiconductor chip is a diode chip.

* * * * *